United States Patent
Archambeault

(10) Patent No.: US 6,381,729 B1
(45) Date of Patent: Apr. 30, 2002

(54) DATA PROCESSING SYSTEM AND METHOD FOR EFFICIENT DETERMINATION OF RETURN CURRENT SPREAD

(75) Inventor: Bruce Roy Archambeault, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/282,300

(22) Filed: Mar. 31, 1999

(51) Int. Cl.$^7$ .............................................. G06F 17/50
(52) U.S. Cl. ................... 716/5; 716/4; 716/15
(58) Field of Search .............................. 716/1, 4, 5, 15; 703/2

(56) References Cited

U.S. PATENT DOCUMENTS

| | | | | |
|---|---|---|---|---|
| 5,625,578 A | * | 4/1997 | Du Cloux et al. | 364/578 |
| 5,812,434 A | * | 9/1998 | Nagase et al. | 364/578 |
| 6,064,808 A | * | 5/2000 | Kapur et al. | 395/500.23 |
| 6,163,762 A | * | 12/2000 | Rautio | 703/5 |

OTHER PUBLICATIONS

Oing et al., "Some Remarks ont eh Prediction of Electromagnetic Radiation from PCBs Using the Method of Moments," Electromagnetic Compatibility Conference, Sept. 1994, pp. 196–201.*

Matsui et al., "SPICE Based Analysis of Radiation from PCBs and Related Structures," IEEE 1997, pages 320–325.*

Kaires, "Radiated Emissions from PCB Traces Including the Effect of Vias, as a Function of Source, Termination and Board Characteristics," IEEE 1998, pp. 872–877.*

Gravelle et al., "EMI/EMC in PCBs—A Literature Review," IEEE Trans. on Electromagnetic Compatibility, Vol. 34, No. 2, May. 1992, pp. 109–116.*

Fujio et al., "Modeling and Analysis on Pass–through Current Decoupling Method for Multi–layer PCB," Int'l Symposium on Electromagnetic Compatibility, May 1999, pp. 365–368.*

\* cited by examiner

*Primary Examiner*—Matthew Smith
*Assistant Examiner*—Leigh Marie Garbowski
(74) *Attorney, Agent, or Firm*—Bracewell & Patterson, LLP; J. Bruce Schelkopf

(57) ABSTRACT

A data processing system and method are disclosed for efficiently determining a total return current spread at an evaluation point in a reference plane in a printed circuit board. A plurality of critical ones of a plurality of traces included within the printed circuit board are identified. For each one of the plurality of critical ones of the plurality of traces, a return current function is determined including a return current value produced by only each one of the plurality of critical ones of the plurality of traces at each point in the reference plane. A total return current spread is determined at the evaluation point utilizing the return current function associated with each one of the plurality of critical ones of the plurality of traces.

8 Claims, 5 Drawing Sheets

DATA PROCESSING SYSTEM AND METHOD FOR EFFICIENT DETERMINATION OF RETURN CURRENT SPREAD

BACKGROUND OF THE INVENTION

1. Field of the Invention

The present invention relates in general to data processing systems and, in particular, to a data processing system and method for efficiently determining a return current spread in a printed circuit board. Still more particularly, the present invention relates to a data processing system and method for efficiently determining a return current spread at an evaluation point in a printed circuit board by adding the return current due to each one of a plurality of critical traces.

2. Description of the Related Art

Microstrip and stripline return currents in printed circuit board reference planes will spread across the reference plane and cause EMI emissions. These EMI emissions increase when external connectors or wires are attached to the board, such as when a keyboard or mouse are connected, or for wires carrying audio signals.

When a printed circuit board is designed, each trace to be included on the board is laid-out in one of the possible trace positions on the board. An engineer laying-out the board must rely on education and experience in selecting the best lay-out of the traces for the board.

Personal computer systems are well known in the art. They have attained widespread use for providing computer power to many segments of today's modern society. Personal computers (PCs) may be defined as a desktop, floor standing, or portable microcomputer that includes a system unit having a central processing unit (CPU) and associated volatile and non-volatile memory, including random access memory (RAM) and basic input/output system read only memory (BIOS ROM), a system monitor, a keyboard, one or more flexible diskette drives, a CD-ROM drive, a fixed disk storage drive (also known as a "hard drive"), a pointing device such as a mouse, and an optional network interface adapter. One of the distinguishing characteristics of these systems is the use of a motherboard or system planar to electrically connect these components together. Examples of such personal computer systems are IBM's PC 300 series, Aptiva series, and Intellistation series.

Currently computers are utilized in the design and lay-out of printed circuit boards. For example, theoretically, full-wave modeling may be utilized to find the currents everywhere on the reference plane due to all of the various traces. However, it is impractical, if not impossible to perform full-wave modeling for each potential circuit board design to determine the total return current spread at each possible evaluation point on the reference plane.

Therefore a need exists for a data processing system and method for efficiently determining a total return current spread at any evaluation point in a reference plane in a printed circuit board.

SUMMARY OF THE INVENTION

A data processing system and method are disclosed for efficiently determining a total return current spread at an evaluation point in a reference plane in a printed circuit board. A plurality of critical ones of a plurality of traces included within the printed circuit board are identified. For each one of the plurality of critical ones of the plurality of traces, a return current function is determined including a return current value produced by only each one of the plurality of critical ones of the plurality of traces at each point in the reference plane. A total return current spread is determined at the evaluation point utilizing the return current function associated with each one of the plurality of critical ones of the plurality of traces.

The above as well as additional objectives, features, and advantages of the present invention will become apparent in the following detailed written description.

BRIEF DESCRIPTION OF THE DRAWINGS

The novel features are set forth in the appended claims. The present invention itself, however, as well as a preferred mode of use, further objectives, and advantages thereof, will best be understood by reference to the following detailed description of a preferred embodiment when read in conjunction with the accompanying drawings, wherein:

DETAILED DESCRIPTION OF A PREFERRED EMBODIMENT

A preferred embodiment of the present invention and its advantages are better understood by referring to FIGS. 1–5 of the drawings, like numerals being used for like and corresponding parts of the accompanying drawings.

The present invention is a method and system for efficiently determining a return current spread at an evaluation point in a printed circuit board by adding together the return currents due to each one of a plurality of critical traces.

The printed circuit board includes a plurality of possible trace positions. A lay-out of the board is created by routing the plurality of traces on the printed circuit by associating each trace with one of the trace positions. Critical traces are determined. An engineer may use any criteria for determining critical traces. For example, the critical traces will typically be determined based on the speed of the signals in the trace.

For each trace position a return current function is determined. The return current function is a one-to-one correspondence assigning a return current value attributable to the trace position to each possible distance from the trace position. A return current function is determined for each trace position taking into consideration only that trace position. The effects on the trace position being evaluated of other trace positions, components on the board, or other elements are not considered.

To determine a total return current spread at an evaluation point on the reference plane, the return current attributable to the trace positions of the critical traces are added together. If an engineer determines that the total current is too high, the traces are rerouted in different trace positions, and the process is repeated.

Figure 1:
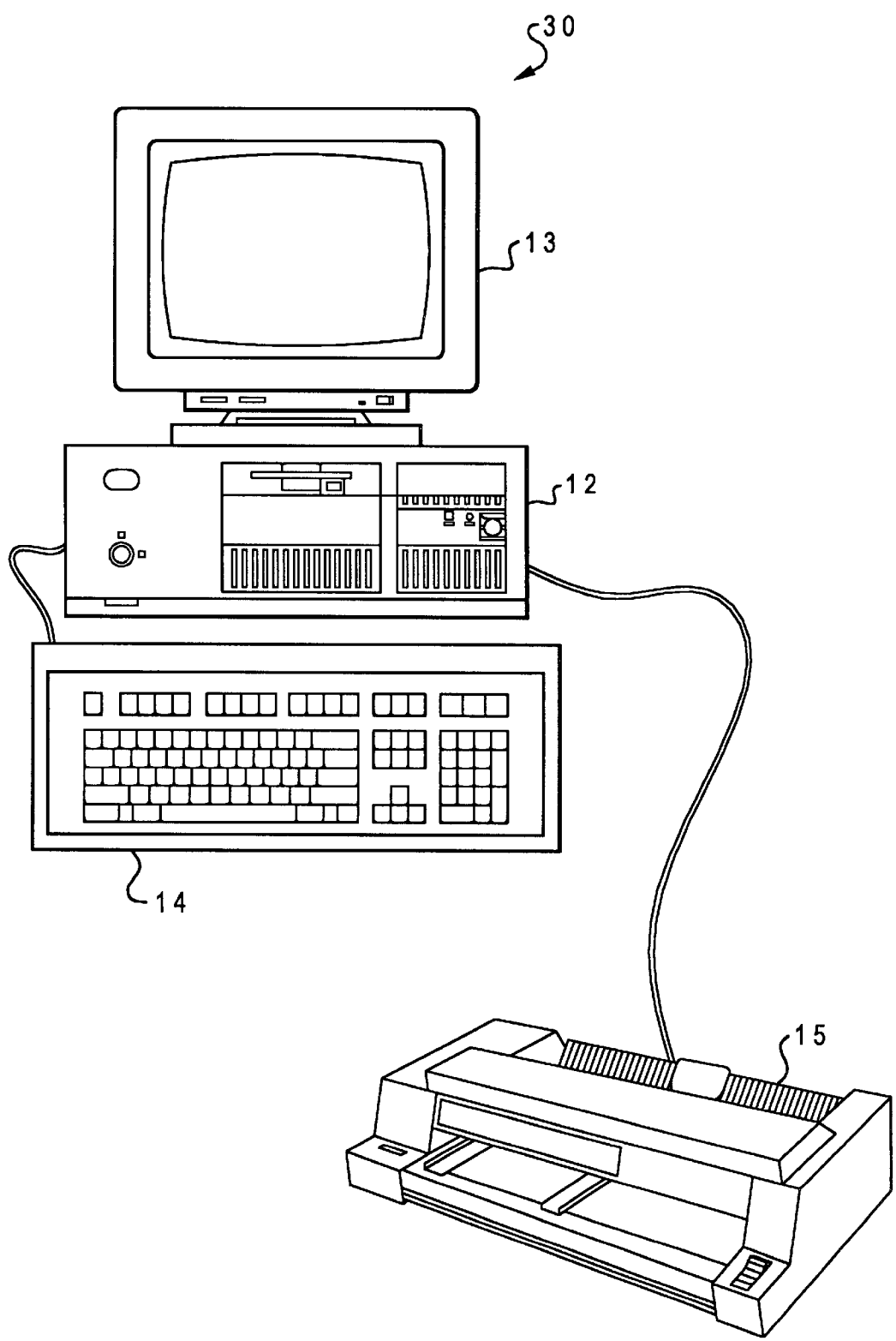
FIG. 1 illustrates a pictorial representation of a data processing system in accordance with the method and system of the present invention.

FIG. 1 illustrates a pictorial representation of a data processing system in accordance with the method and system of the present invention. Computer system 30 includes a computer 12, a monitor 13, a keyboard 14, and a printer or plotter 15. Computer system 30 may be implemented utilizing any commercially available computer system which has been suitably programmed and which has been modified to execute the method as described below.

Figure 2A:
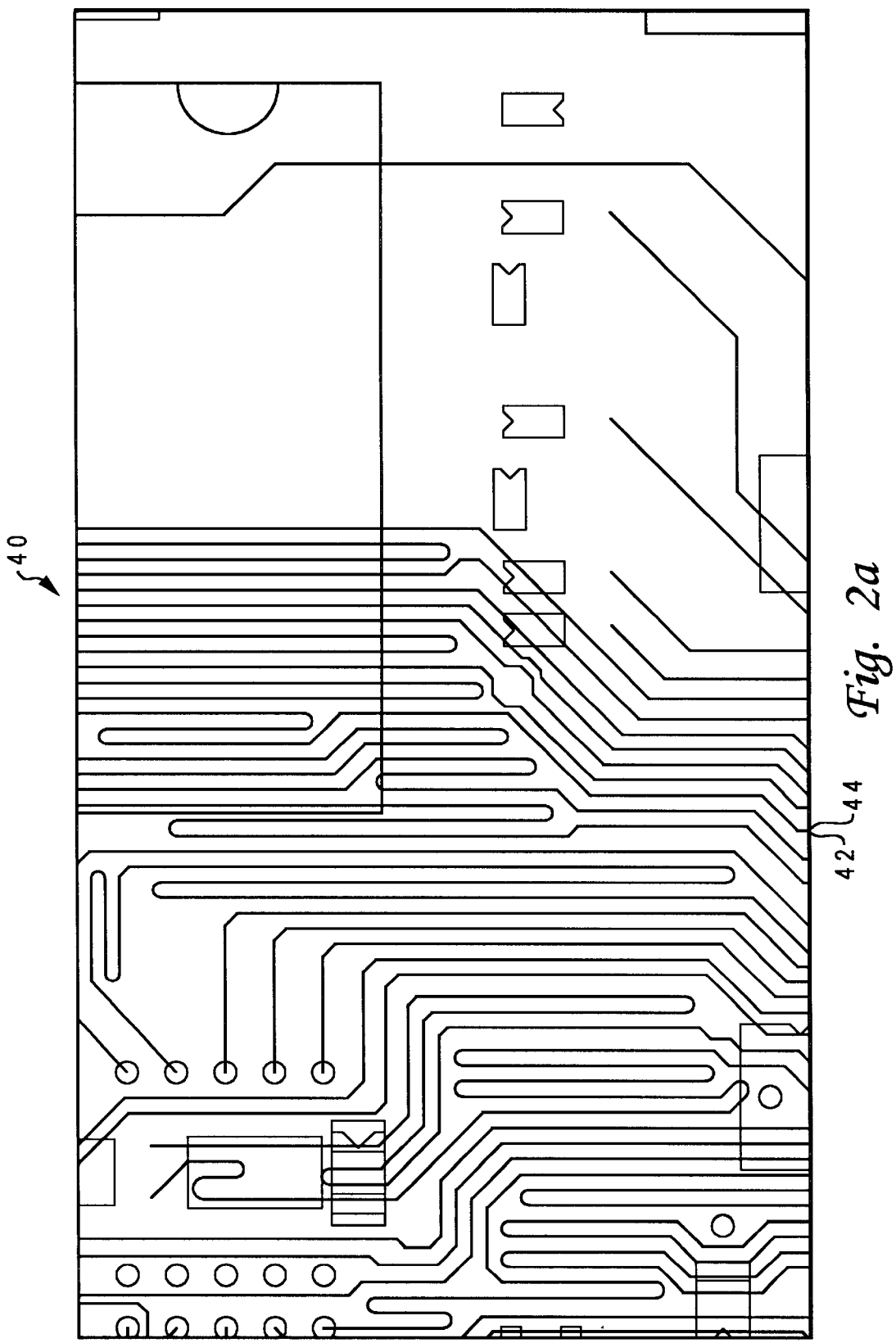
FIG. 2a depicts a pictorial representation of a printed circuit board having a plurality of traces in accordance with the method and system of the present invention.
Figure 2B:
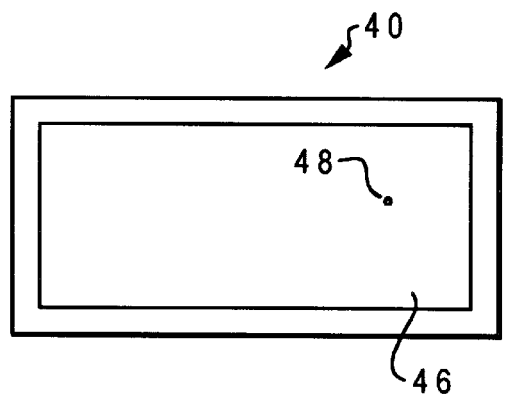
FIG. 2b illustrates a pictorial representation of a reference plane included within the printed circuit board of FIG. 2a in accordance with the method and system of the present invention.

FIG. 2a depicts a pictorial representation of a printed circuit board having a plurality of traces in accordance with the method and system of the present invention. FIG. 2b illustrates a pictorial representation of a reference plane included within the printed circuit board of FIG. 2a in accordance with the method and system of the present invention. A printed circuit board 40 includes a plurality of traces routed in a plurality of trace positions. For example, trace 42 is currently located at and associated with trace position 44. The traces may be microstrip or stripline traces. The microstrip traces are traces on the outside of a printed circuit board. The stripline traces are traces between two reference planes. The return current from trace 42 will spread across a reference plane 46 in board 40 in accordance with a return current function determined for trace position 44.

At an evaluation point 48 in reference plane 46 the total return current spread will include a return current due in some part to all of the traces included on board 40. To determine the total return spread at evaluation point 48, the return currents due to critical traces are added together. In order to determine the return current due to each critical trace, a return current function is determined.

Figure 3:
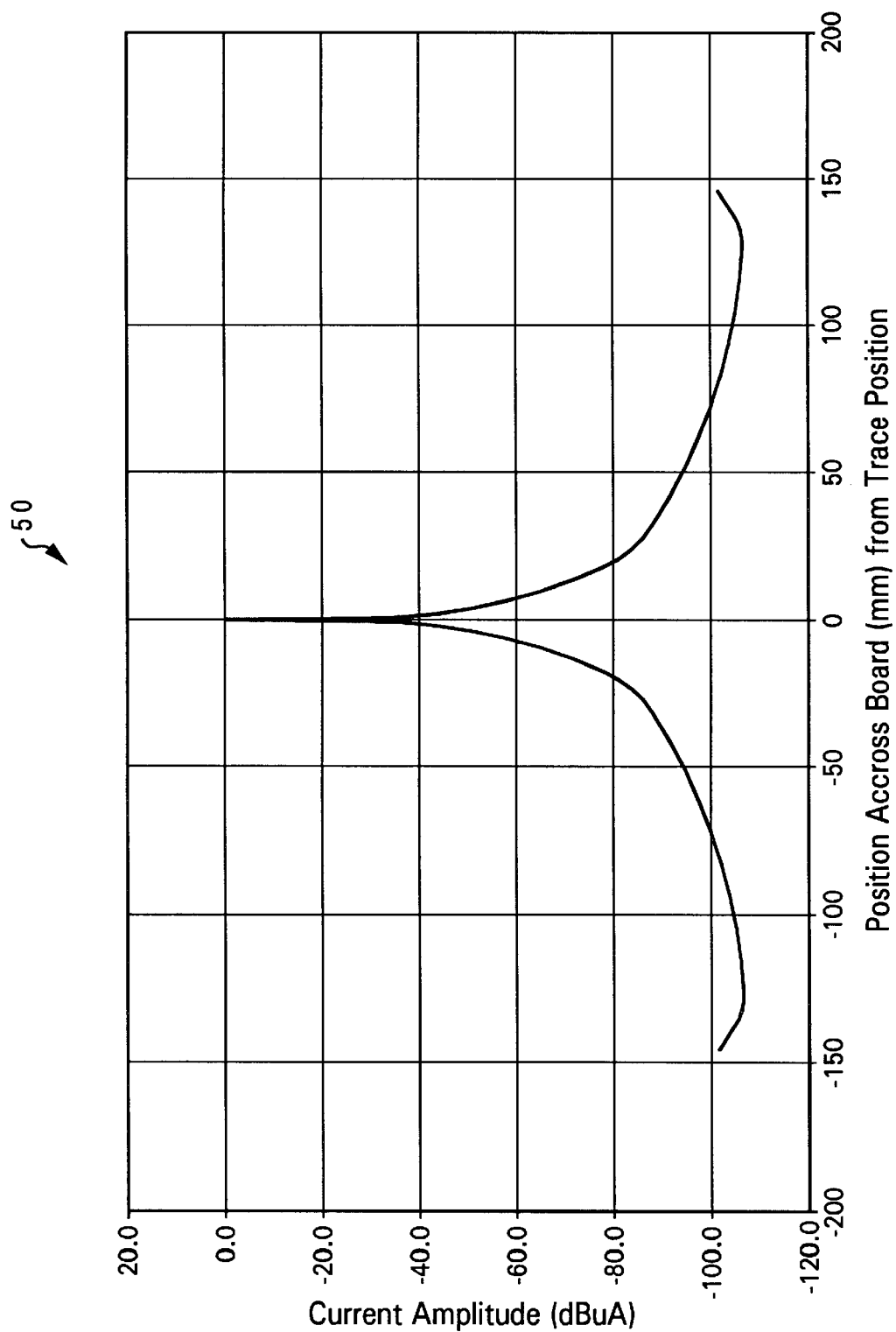
FIG. 3 illustrates a graphical representation of a return current function associated with a trace position included within a printed circuit board in accordance with the method and system of the present invention.

FIG. 3 illustrates a graphical representation of a return current function associated with a trace position included within a printed circuit board in accordance with the method and system of the present invention. Return current function 50 is determined by performing full-wave modeling of trace position 44. Return current function 50 is determined considering only its associated trace position 44. No other trace position is taken into consideration when performing the full-wave modeling of trace location 44. A return current function, similar to function 50, is then determined for each trace position.

The value of the return current attributable to trace position 44 associated with return current function 50 may be determined for any evaluation point location on printed circuit board 40. To find a total return current at an evaluation point, the return current determined from function 50 must be added to the return currents determined utilizing the functions associated with each of the other critical traces.

Figure 4:
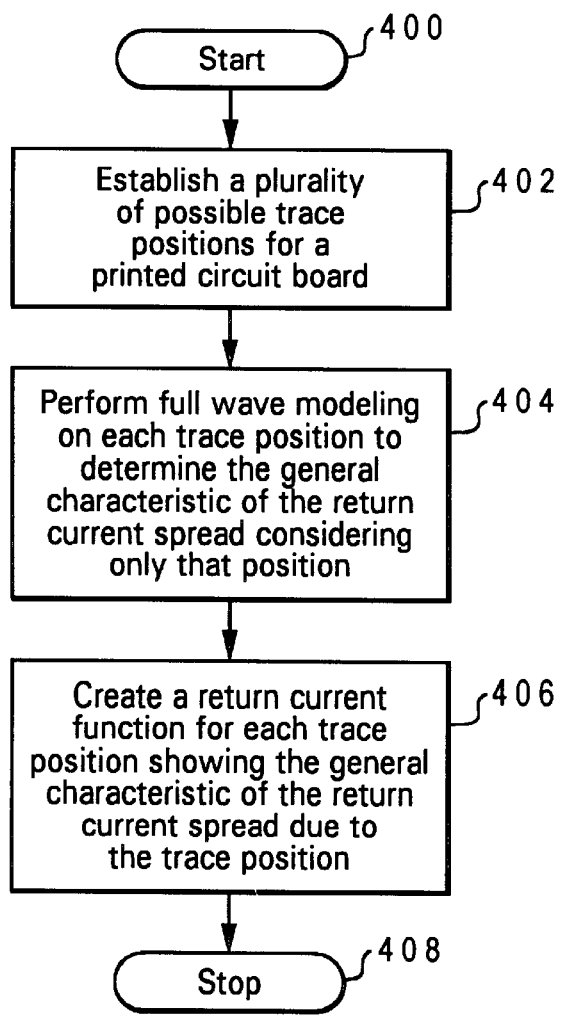
FIG. 4 depicts a high level flow chart which illustrates creating a return current function for each trace position in a printed circuit board in accordance with the method and system of the present invention.

FIG. 4 depicts a high level flow chart which illustrates creating a return current function for each trace position in a printed circuit board in accordance with the method and system of the present invention. The process starts as depicted at block 400 and thereafter passes to block 402 which illustrates establishing a plurality of possible trace positions for a printed circuit board. Next, block 404 depicts performing full wave modeling on each of the possible trace positions to determine the general characteristic of the return current spread for the position. In this manner, full wave modeling is completed on each possible trace position without taking into consideration the effects of other traces, other components, or characteristics of the printed circuit board. The modeling is completed assuming the trace position being analyzed is the only trace on the board. Each possible trace position is analyzed in this manner to determine the return current spread for the trace.

Thereafter, the process passes to block 406 which depicts the creation of a return current function for each trace position utilizing the general characteristic of the return current determined in block 404. The process then terminates as illustrated at block 408.

Figure 5:
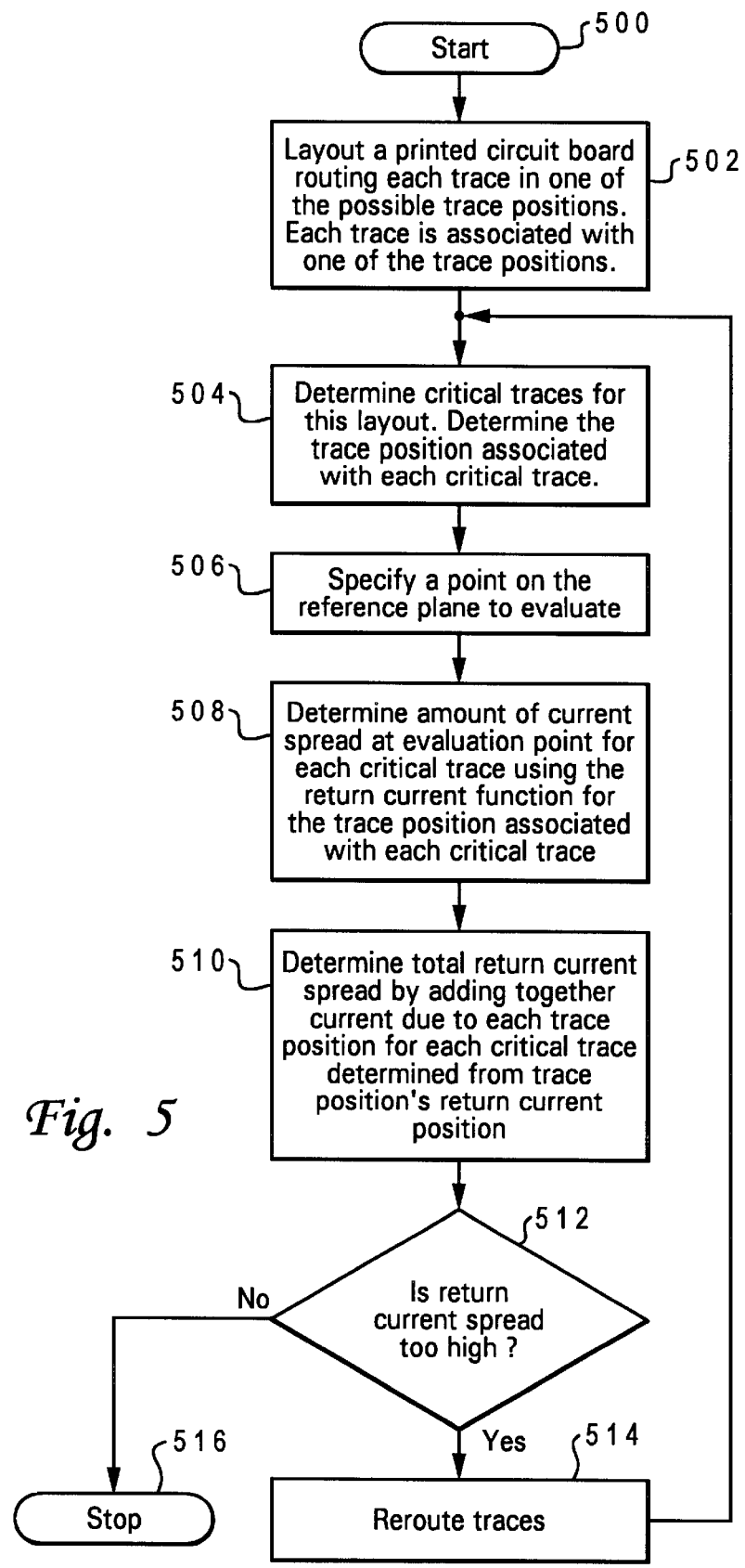
FIG. 5 illustrates a high level flow chart which depicts analyzing the total return current at an evaluation point on a printed circuit board utilizing the return current functions associated with critical traces in accordance with the method and system of the present invention.

FIG. 5 illustrates a high level flow chart which depicts analyzing the total return current at an evaluation point on a printed circuit board utilizing the return current functions associated with critical traces in accordance with the method and system of the present invention. The process starts as depicted at block 500 and thereafter passes to block 502 which illustrates an engineer laying out a printed circuit board. Each trace is routed utilizing one of the possible trace positions. Next, block 504 depicts the engineer determining critical traces for this particular layout. The critical traces may be determined based on the speed of the signals to be carried on the trace, or any other criteria the engineer desires to use.

Next, block 506 illustrates the specification of a point on the reference plane to evaluate. Thereafter, block 508 depicts the determination of the amount of current spread at the evaluation point for each critical trace using the return current functions for each critical trace. The process then passes to block 510 which illustrates determining a total return current at the evaluation point by adding the return currents due to each critical trace. Block 512, then, depicts a determination of whether or not the total return current spread at the evaluation point is too high. If a determination is made that the total return current spread at the evaluation point is too high, the process passes to block 514 which illustrates rerouting the traces. The process then passes to block 504. Referring again to block 512, if a determination is made that the total return current spread at the evaluation point is not too high, the process terminates as depicted at block 516.

While a preferred embodiment has been particularly shown and described, it will be understood by those skilled in the art that various changes in form and detail may be made therein without departing from the spirit and scope of the present invention.

What is claimed is:

1. A method in a data processing system for efficiently determining a total return current spread at an evaluation point in a reference plane in a printed circuit board, said method comprising the steps of:

creating a lay-out of said printed circuit board by associating each of a plurality of traces with one of a plurality of possible trace positions within said printed circuit board;

identifying a plurality of critical ones of said plurality of traces and for each one of said plurality of critical ones of said plurality of traces, determining a return current function including a return current value produced by only each one of said plurality of critical ones of said plurality of traces at each point in said reference plane;

determining a total return current spread at said evaluation point utilizing said return current function associated with each one of said plurality of critical ones of said plurality of traces;

determining whether said total return current spread at said evaluation point is acceptable; and in response to said total return current spread being unacceptable, creating a second lay-out of said printed circuit board whereby at least one of said plurality of traces is associated with a different one of said plurality of possible trace positions.

2. The method according to claim 1, further comprising the steps of:

determining a return current value produced by only each one of said plurality of critical ones of said plurality of traces at said evaluation point in said reference plane for each one of said plurality of critical ones of said plurality of traces; and determining said total return current spread at said evaluation point by adding together all return current values determined for each one of said plurality of critical ones of said plurality of traces.

3. The method according to claim 1, further comprising the step of establishing said plurality of possible trace positions on said printed circuit board.

4. The method according to claim 1, further comprising the step of for each one of said plurality of critical ones of said plurality of traces, determining a return current function utilizing full-wave modeling to determine a return current value produced by only each one of said plurality of critical ones of said plurality of traces at each point in said reference plane.

5. A data processing system for efficiently determining a total return current spread at an evaluation point in a reference plane in a printed circuit board, comprising:

said system executing code for creating a lay-out of said printed circuit board by associating each of a plurality of traces with one of a plurality of possible trace positions within said printed circuit board;

said system executing code for identifying a plurality of critical ones of said plurality of traces and determining for each one of said plurality of critical ones of said plurality of traces a return current function including a return current value produced by only each one of said plurality of critical ones of said plurality of traces at each point in said reference plane;

said system executing code for determining a total return current spread at said evaluation point utilizing said return current function associated with each one of said plurality of critical ones of said plurality of traces;

said system executing code for determining whether said total return current spread at said evaluation point is acceptable; and said system executing code for creating a second lay-out of said printed circuit board wherein at least one of said plurality of traces is associated with a different one of said plurality of possible trace positions in response to said total return current spread being unacceptable.

6. The system according to claim 5, further comprising:

said system executing code for determining a return current value produced by only each one of said plurality of critical ones of said plurality of traces at said evaluation point in said reference plane for each one of said plurality of critical ones of said plurality of traces; and said system executing code for determining said total return current spread at said evaluation point by adding together all return current values determined for each one of said plurality of critical ones of said plurality of traces.

7. The system according to claim 5, further comprising said system executing code for establishing said plurality of possible trace positions on said printed circuit board.

8. The system according to claim 5, further comprising said system executing code for determining a return current function for each one of said plurality of critical ones of said plurality of traces utilizing full-wave modeling to determine a return current value produced by only each one of said plurality of critical ones of said plurality of traces at each point in said reference plane.

* * * * *